(12) United States Patent
Lou

(10) Patent No.: US 6,468,858 B1
(45) Date of Patent: Oct. 22, 2002

(54) METHOD OF FORMING A METAL INSULATOR METAL CAPACITOR STRUCTURE

(75) Inventor: Chine-Gie Lou, Hsinchu Hsien (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 54 days.

(21) Appl. No.: 09/814,974

(22) Filed: Mar. 23, 2001

(51) Int. Cl.⁷ .......................................... H01L 21/8242
(52) U.S. Cl. ........................ 438/253; 438/239; 438/254
(58) Field of Search ................................ 438/253, 239, 438/254

(56) References Cited

U.S. PATENT DOCUMENTS

| | | | |
|---|---|---|---|
| 5,789,320 A | 8/1998 | Andricacos et al. | 438/678 |
| 6,130,449 A * | 10/2000 | Matsuoka et al. | 257/296 |
| 6,153,460 A | 11/2000 | Ohnishi et al. | 438/238 |
| 6,159,793 A | 12/2000 | Lou | 438/255 |
| 6,207,524 B1 * | 3/2001 | Gutsche | 438/396 |
| 6,235,579 B1 * | 5/2001 | Lou | 438/253 |
| 6,274,424 B1 * | 8/2001 | White | 438/239 |
| 6,313,031 B1 * | 11/2001 | Schuele et al. | 438/643 |

* cited by examiner

Primary Examiner—Alexander Ghyka
(74) Attorney, Agent, or Firm—George O. Saile; Stephen B. Ackerman

(57) ABSTRACT

A process for forming a metal—insulator—metal (MIM), capacitor structure, in which platinum is employed for both the capacitor top plate and storage node structures, while a high dielectric constant layer, such as $BaTiO_3$ is used for the capacitor dielectric layer, has been developed. Prior to formation of the MIM capacitor structure, an underlying, platinum storage node plug structure is formed in a narrow diameter opening, allowing communication between the MIM capacitor structure, and regions of an underlying transfer gate transistor, to be realized. A thin ruthenium shape is used as a seed layer to allow an electroless plating procedure to be employed for attainment of the platinum storage node plug structure.

24 Claims, 4 Drawing Sheets

METHOD OF FORMING A METAL INSULATOR METAL CAPACITOR STRUCTURE

BACKGROUND OF THE INVENTION (1) Field of the Invention

The present invention relates to methods used to fabricate semiconductor devices, and more specifically to a method used to form a metal—insulator—metal (MIM), capacitor structure for a dynamic random access memory (DRAM), device.

(2) Description of Prior Art

The advent of micro-miniaturization, or the ability to fabricate semiconductor devices using sub-micron features, has allowed the performance of these sub-micron devices to be increased while still maintaining, or even decreasing, the manufacturing costs for these same devices. Smaller semiconductor chips, still offering device densities equal to, or greater than, device densities achieved with larger size semiconductor chips, have allowed a greater number of the smaller semiconductor chips to be obtained from a specific size substrate, thus reducing the manufacturing cost for a specific chip. The smaller semiconductor chips however, such a dynamic random access memory (DRAM) chips, are now comprised with smaller individual transfer gate transistors, which in turn commit less horizontal space for the DRAM stacked capacitor structures, which directly overlay the transfer gate transistor. Therefore to satisfy capacitance requirements novel designs for DRAM capacitor structures, featuring increased vertical features needed to compensate for the decreased horizontal features now necessitated with sub-micron DRAM devices, have been employed. Storage node components, of DRAM capacitor structures, have been fabricated with fin type features, crown shaped features, and cylindrical shaped features, in an attempt to increase the surface area of a DRAM capacitor structure which now directly overlays a horizontally shrinking, underlying DRAM transfer gate transistor component.

However the processes used to fabricate DRAM capacitor structures, comprised with fin type, crown shaped, or cylindrical type features, although resulting in the desired increase in capacitor surface are, however do increase process complexity and cost. The present invention will describe a process for forming an MIM capacitor structure, for a DRAM device, in which a capacitor dielectric layer exhibiting a high dielectric constant is employed to increase capacitance when compared to counterpart capacitor structures, comprised with a lower dielectric constant, capacitor dielectric layer. The use of the higher dielectric constant, capacitor dielectric layer, in addition to its use in a cylindrical shaped capacitor structure, result in the increased capacitance required for the sub-micron DRAM devices, now employed in designs of a 256 MB or greater. However this invention will primarily feature the novel use of a noble metal plug structure, used underlying the capacitor structure, and formed using an electroless plating procedure which allows a voidless, noble metal plug structure to be obtained. Prior art, such as Lou in U.S. Pat. No. 6,159,793, describe a process for forming an MIM capacitor structure, however that prior art does not detail the materials, or process sequence, specifically the use of, and the method of forming, a noble metal plug structure, featured in this present invention.

SUMMARY OF THE INVENTION

It is an object of this invention to fabricate a metal—insulator—metal (MIM), capacitor structure, for a DRAM device.

It is another object of this invention to use storage node structure comprised of platinum, and to form the platinum storage node structure in a capacitor opening, overlying and contacting an underlying platinum plug structure.

It is still another object of this invention to form a high dielectric constant, capacitor dielectric layer, such as $BaTiO_3$, or $Ta_2O_5$, on the underlying platinum storage node structure.

It is still yet another object of this invention to use an electroless plating procedure to form a platinum plug structure on a landing pad exposed at the bottom of an opening in an insulator layer, prior to the formation of the overlying capacitor structure, with the landing pad comprised of tungsten, and comprised with an overlying ruthenium layer, used as a seed layer for the electroless platinum plating procedure.

In accordance with the present invention a process for forming a metal—insulator—metal (MIM), capacitor structure, overlying and contacting a platinum plug structure, in turn formed via electroless plating on a ruthenium seed layer, is described. A landing pad structure, comprised of a ruthenium seed layer overlying a tungsten layer, is defined either directly on a source/drain region of a transfer gate transistor, or defined on a top surface of a polysilicon plug structure which in turn contacts the underlying source/drain region. After deposition of an interlevel dielectric (ILD), layer, an opening is formed in a first ILD layer exposing a portion of the top surface of the ruthenium seed layer. An electroless plating procedure is then employed to fill the opening in the ILD layer with a voidless platinum plug structure. A capacitor opening is then formed in a second ILD layer exposing the top surface of the platinum contact plug structure. After formation of silicon nitride spacers on the sides of the capacitor opening, a platinum storage node structure is formed in the capacitor opening, overlying and contacting the top surface of the underlying platinum contact plug structure. After deposition of a high dielectric constant (high k), layer, such as $Ta_2O_5$ or $BaTiO_3$, a platinum layer is deposited. A patterning procedures is then used to define a capacitor top plate structure, and a capacitor dielectric layer, resulting in an MIM capacitor structure comprised of an overlying platinum upper electrode structure, a high k capacitor dielectric layer, and an underlying platinum storage node structure, with the MIM capacitor structure located in the capacitor opening, overlying and contacting the platinum contact plug structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating an MIM capacitor structure, overlying and contacting an electroless plated platinum contact plug structure, which in turn is formed on an underlying ruthenium seed layer, will now be described in detail. A novel feature of this invention, a tungsten landing pad, with an overlying ruthenium layer, used to accept the electroless plated platinum plug structure, can be formed directly on a source/drain region of a transfer gate transistor, or the novel landing pad can be formed on a polysilicon plug structure which is used to optimize planarity, connecting the underlying source/drain region to a subsequently formed overlying landing pad structure. For this invention the latter option, the insertion of the polysilicon plug structure will be described, however this invention can be easily accomplished with the landing pad formed directly on a source/drain region.

Figure 1:
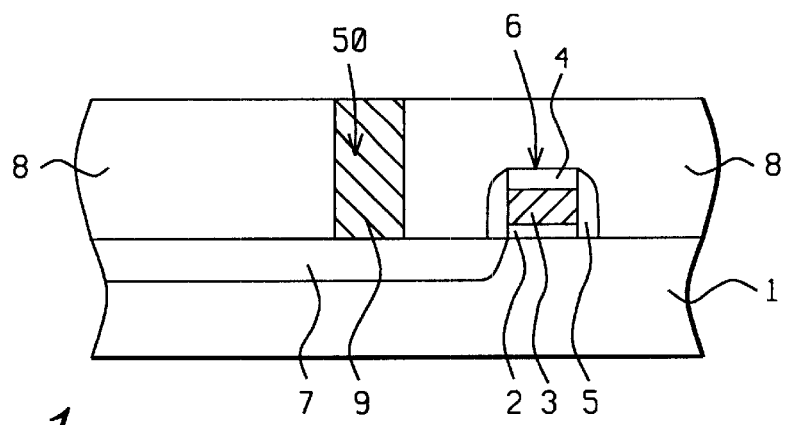
FIGS. 1–9, which schematically, in cross-sectional style, describe key stages of fabrication of an MIM capacitor structure, overlying and contacting an electroless plated, voidless, platinum contact plug structure.

FIG. 1, schematically shows the formation of the components of the DRAM device prior to initiation of the landing pad fabrication process. A P type semiconductor substrate 1, comprised of single crystalline silicon, with a <100> crystallographic orientation, is used. Gate insulator layer 2, comprised of silicon dioxide, is next thermally grown to a thickness between about 30 to 250 Angstroms. A polysilicon layer is next deposited via low pressure chemical vapour deposition (LPCVD), procedures, to a thickness between about 1000 to 3000 Angstroms, followed by the deposition of a silicon nitride layer, at a thickness between about 500 to 2000 Angstroms, via LPCVD or via plasma enhanced chemical vapour deposition (PECVD), procedures. The polysilicon layer can be doped in situ during deposition via the addition of arsine or phosphine to a silane ambient, or deposited intrinsically then doped via implantation of arsenic or phosphorous ions. Conventional photolithographic and reactive ion etching (RIE), procedures are then employed to form a silicon nitride capped, gate structure, comprised of silicon nitride shape 4, and underlying polysilicon gate structure 3. If lower word line resistance is desired a polycide gate structure, comprised of an overlying metal silicide, and underlying in situ doped polysilicon, can be used. Insulator spacers 5, comprised of silicon nitride, or silicon oxide, at a thickness between about 500 to 1500 Angstroms, are next formed on the sides of the silicon nitride capped, gate structure. This is accomplished via deposition of silicon nitride or silicon oxide, via LPCVD or PECVD procedures, followed by an anisotropic RIE procedure. Silicon nitride capped gate structure, now including insulator spacers 5, will be referred to as gate structure 6, shown schematically in FIG. 1. Source/drain region 7, is next formed in regions of semiconductor substrate 1, not covered by gate structure 6. This is accomplished via implantation of arsenic or phosphorous ions, at an energy between about 30 to 70 KeV, at a dose between about 1E13 to 1E16 atoms/cm$^2$.

As previously mentioned the novel landing pad structure will be described for a first option in which it is formed on a planarized ILD layer, overlying and contacting the top surface of a polysilicon plug, which in turn will contact a source/drain region of the transfer gate transistor. However if desired a second option, not described in this invention, is to form the landing pad structure directly on source/drain region 7. Therefore regarding the first option, first ILD layer 8, comprised of either a silicon oxide layer, or a borophosphosilicate glass (BPSG), layer, is deposited via LPCVD or PECVD procedures, at a thickness between about 3000 to 7000 Angstroms. A chemical mechanical polishing (CMP), procedure is next used to planarize first ILD layer 8. Conventional photolithographic and RIE procedures, using CHF$_3$ as an etchant for first ILD layer 8, are employed to form opening 50, in first ILD layer 8, exposing a portion of the top surface of source/drain region 7. A polysilicon layer, in situ doped during deposition via the addition of arsine or phosphine, to a silane ambient, is next deposited via LPCVD procedures, at a thickness between about 1500 to 3000 Angstroms, completely filling opening 50. Removal of regions of the polysilicon layer from the top surface of first ILD layer 8, via CMP or selective RIE procedures using Cl$_2$ as an etchant, result in the formation of polysilicon plug structure 9, in opening 50, contacting a portion of source/drain region 7. This is schematically shown in FIG. 1.

Figure 2:
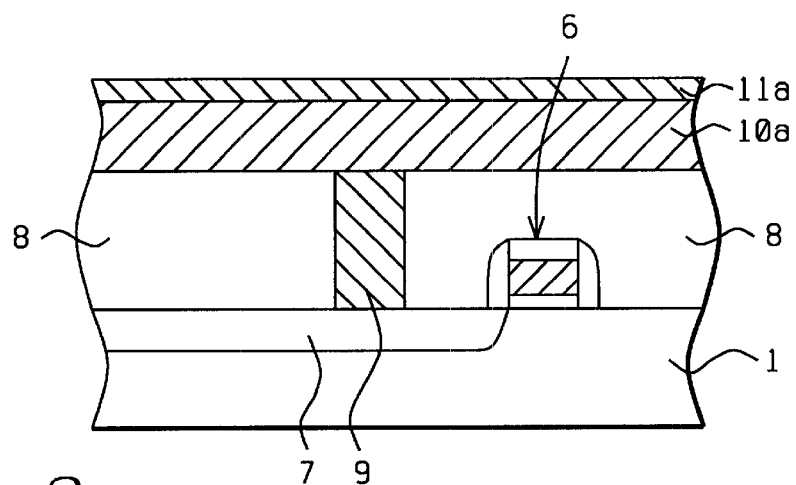
Figure 3:
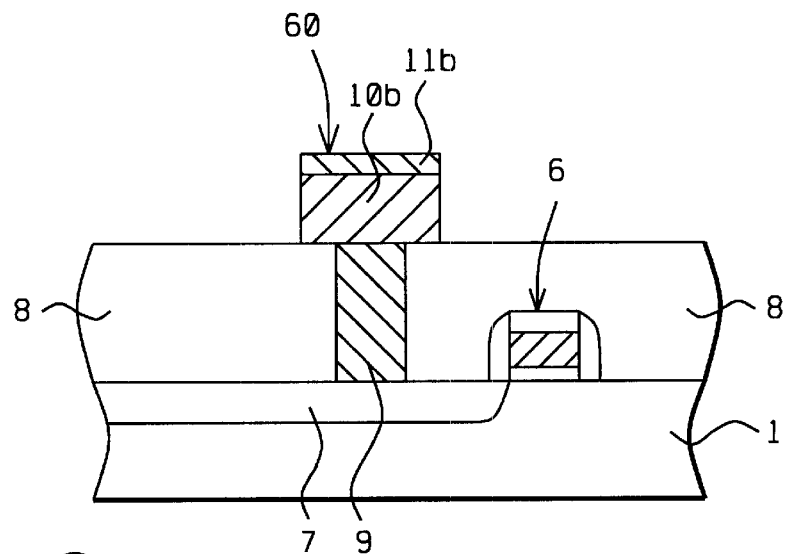

The formation of the novel landing pad structure, needed to accommodate, and underlay, a subsequent platinum storage node contact plug structure, is next addressed and described schematically using FIGS. 2–3. Tungsten layer 10a, is deposited at a thickness between about 1000 to 4000 Angstroms, via LPCVD procedures, using tungsten hexafluoride as a source. Thin ruthenium layer 11a, is then deposited on tungsten layer 10a, via physical vapor deposition (PVD) procedures, at a thickness between about 300 to 2000 Angstroms. The presence of ruthenium will serve as a seed layer for subsequent electroless plating of platinum. This is schematically shown in FIG. 2. A photoresist shape, (not shown in the drawings), is next used as an etch mask to allow an anisotropic RIE procedure, using Cl$_2$ or SF$_6$ as an etchant for ruthenium and tungsten, to define landing plug structure 60, comprised of underlying tungsten shape 10b, and overlying ruthenium seed shape 11b. This is schematically shown in FIG. 3. The photoresist shape, used for definition of landing pad structure 60, is removed via plasma oxygen ashing and careful wet cleans.

Figure 4:
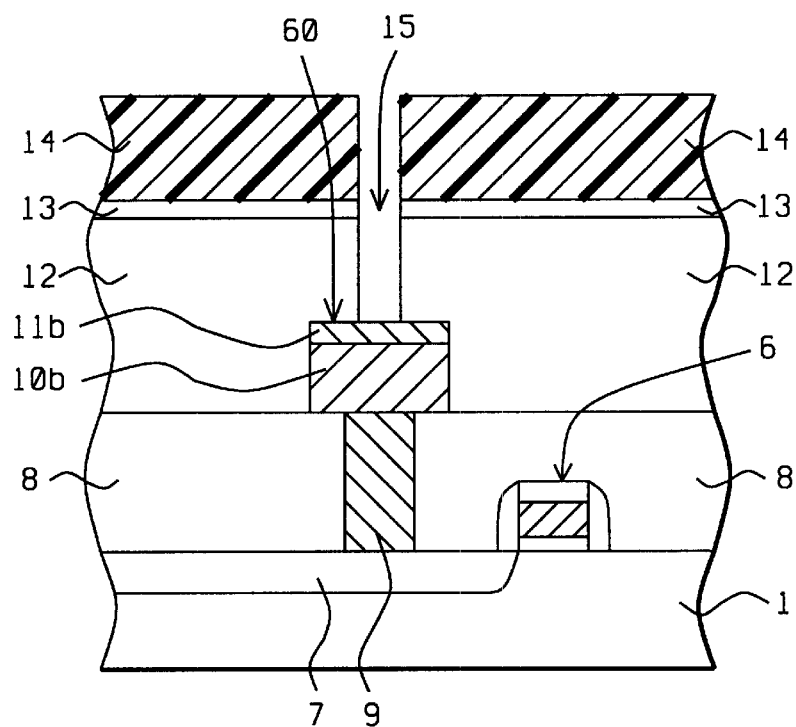

Second ILD layer 12, again comprised of either silicon oxide or BPSG, is next deposited via PECVD or LPCVD procedures, to a thickness between about 3000 to 10000 Angstroms, followed by a CMP procedure used for planarization purposes, resulting in a smooth top surface for second ILD layer 12. Silicon nitride layer 13, is then deposited on planarized, second ILD layer 12, at a thickness between about 300 to 2000 Angstroms, via PECVD or LPCVD procedures. Photoresist shape 14, is next used as an etch mask allowing storage node contact hole 15, to be formed in silicon nitride layer 13, and in second ILD layer 12, exposing a portion of the top surface of ruthenium seed shape 11b. Storage node contact hole 15, is defined via a selective, anisotropic RIE procedure, using CHF$_3$ or CF$_4$ as an etchant for silicon nitride and for silicon oxide ort BPSG. The diameter of storage node contact hole 15, schematically shown in FIG. 4, is between about 500 to 3000 Angstroms. Photoresist shape 14, is then removed via plasma oxygen ashing and careful wet cleans.

Figure 5:
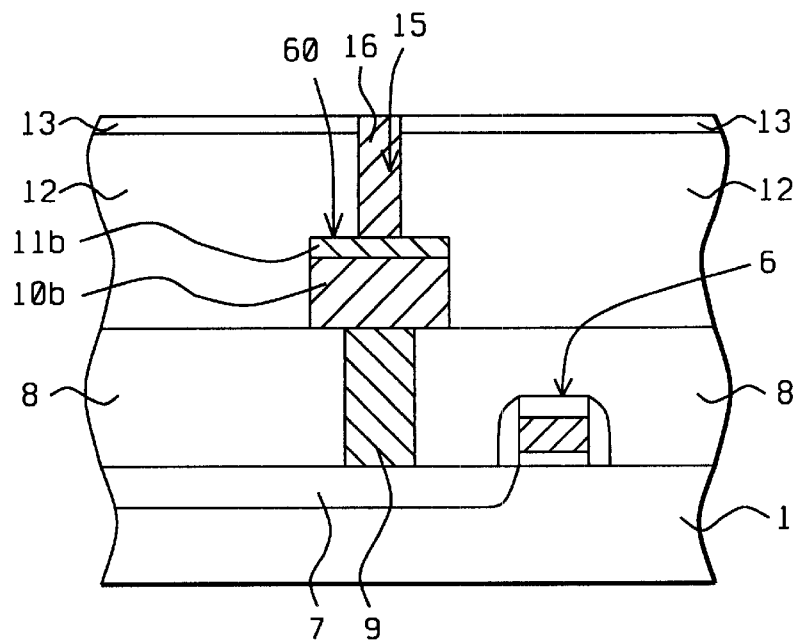

The formation of platinum plug structure 16, is next addressed and schematically shown in FIG. 5. Since the current carrying capabilities of the plug structure is limited due to placement in, and being confined to the dimensions of, narrow diameter, storage node contact hole 15, a material more conductive then conventionally used doped polysilicon is desired. In addition a voidless plug structure is desired, and therefore a method of filling the narrow diameter, storage node contact hole, other than an LPCVD procedure which would fill the narrow diameter, storage node contact hole via sidewall deposition, is needed. Therefore to satisfy these requirements narrow diameter, storage node contact hole 15, is filled with voidless platinum, via an electroless plating procedure, using ruthenium seed shape 11b, as the seed layer. The electroless plating procedure, performed in a solution of de-ionized H$_2$O, dilute hydrofluoric (DHF) acid, and platinum sulfate (PtSO$_4$), at a temperature between about 25 to 150° C., and at a current density between about 3 to 100 amps/cm$^2$, results in the filling of storage contact hole 15, with platinum plug structure 16, shown schematically in FIG. 5. The mode of formation of platinum plug structure 16, electroless plating, allows the platinum plug structure to initiate, and continue to grow, from underlying ruthenium seed shape 11b, resulting in a voidless plug structure.

Figure 6:
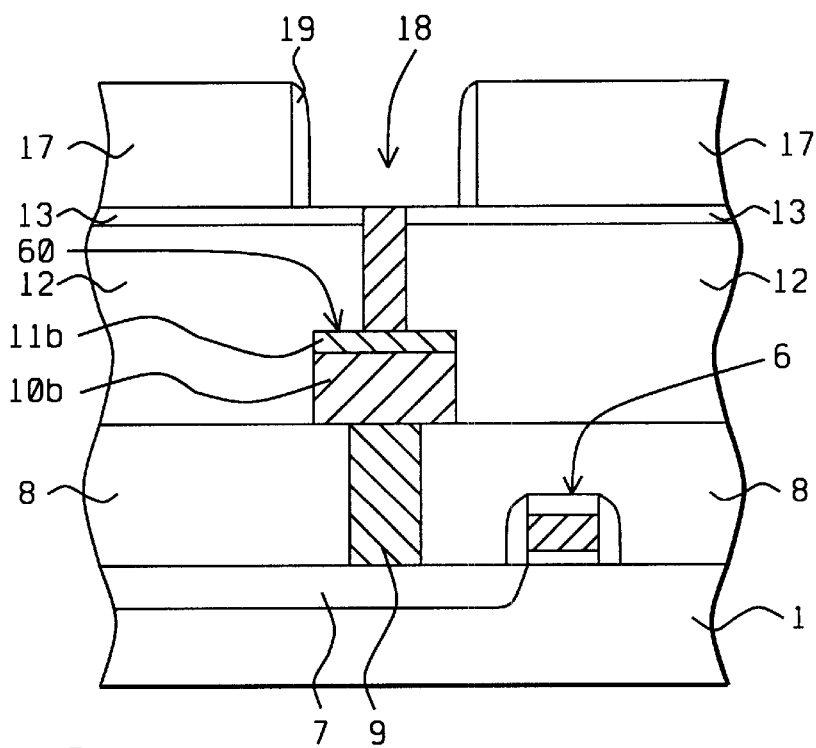

Third ILD layer 17, again comprised of either silicon oxide, or BPSG, is deposited via LPCVD or PECVD procedures, to a thickness between about 6000 to 15000 Angstroms. Conventional photolithographic and anisotropic RIE procedures, using $CHF_3$ or $CF_4$ as an etchant, are used to define capacitor opening 18, in third ILD layer 17, exposing the top surface of platinum plug structure 16. Silicon nitride spacers 19, at a thickness between about 300 to 1500 Angstroms, are next formed on the sides of capacitor opening 18. This is accomplished via deposition of a silicon nitride layer, at a thickness between about 300 to 1500 Angstroms, via LPCVD or PECVD procedures, followed by a selective, anisotropic RIE procedure, using $Cl_2$ as a selective etchant for silicon nitride. This is schematically shown in FIG. 6.

Figure 7:
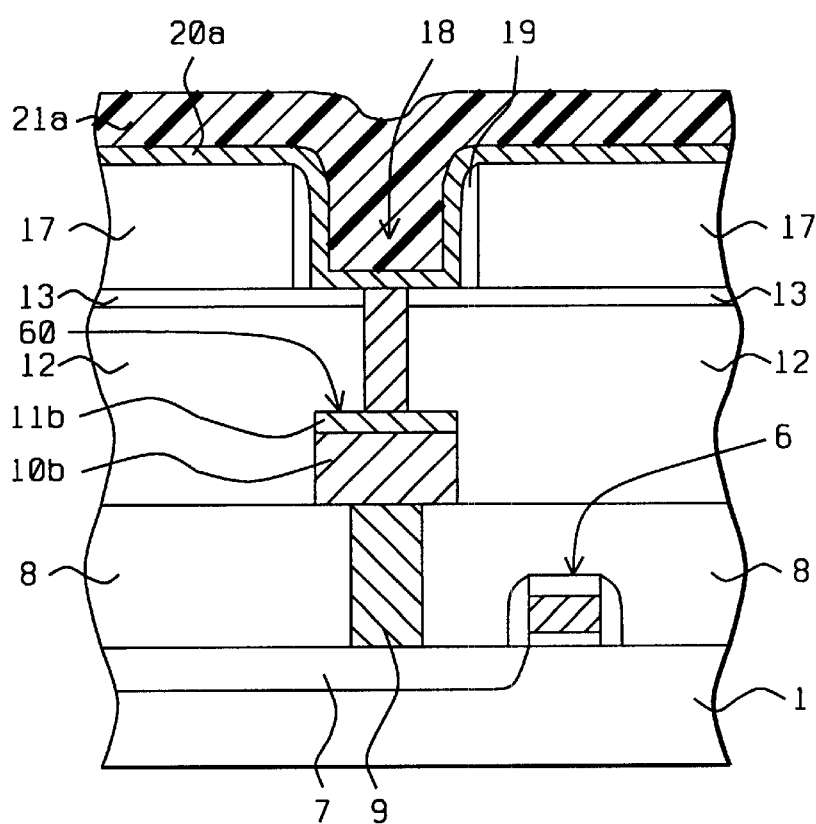
Figure 8:
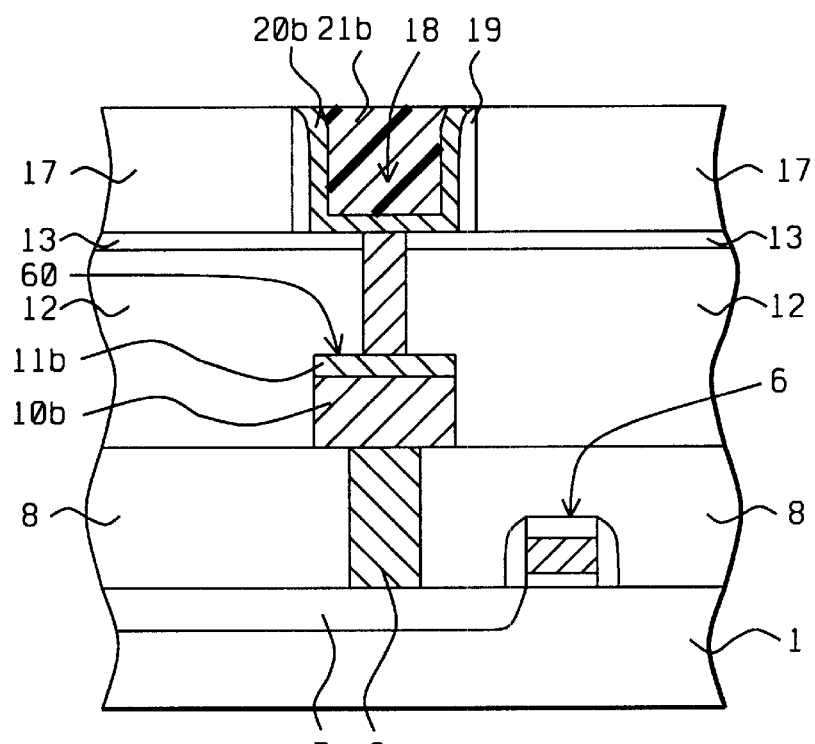
Figure 9:
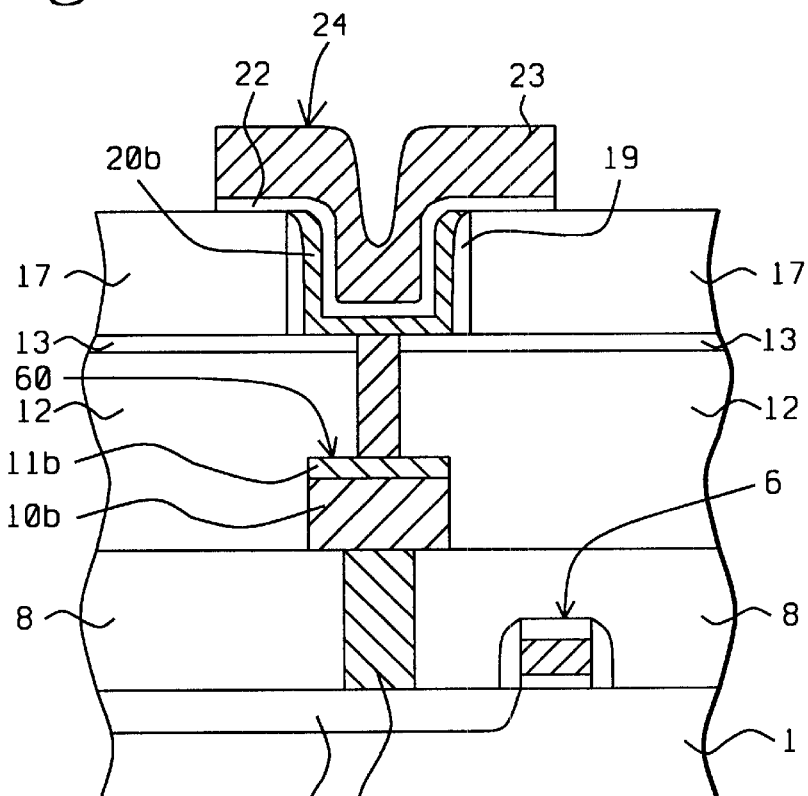

The formation of a capacitor structure, in capacitor opening 18, is now addressed, schematically described in FIGS. 7–9. Platinum layer 20a, shown schematically in FIG. 7, is deposited using plasma vapour deposition (PVD), procedures, at a thickness between about 300 to 800 Angstroms. Platinum layer 20a, interfaces silicon nitride, (silicon nitride spacers 19, and silicon nitride layer 13), on all surfaces of capacitor opening 18, except in the area in which platinum layer 20a, overlays the top portion of platinum plug structure 16. The use of silicon nitride underlying platinum layer 20a, will allow increased adhesion of a subsequent platinum storage node structure to be achieved when compared to counterparts in which a platinum storage node structure interfaced silicon oxide surfaces. Photoresist shape 21a, is next formed completely filling capacitor opening 18. A CMP procedure is then employed to first remove portions of photoresist shape 21a, from the top surface of the portion of platinum layer 20a, which in turn is located on the top surface of third ILD layer 17. The CMP procedure is then continued to remove portions of platinum layer 20a, not covered by photoresist shape 21a, resulting in the formation of platinum storage node structure 20b, in capacitor opening 18, now covered by remaining photoresist plug 21b. This is schematically shown in FIG. 8. Photoresist plug 21b, is then removed via plasma oxygen ashing and careful wet cleans. The ability of platinum to experience less oxidation than counterparts such as polysilicon, allow the ashing procedure to be successfully performed.

A high k layer 22, such as $Ta_2O_5$ or $BaTiO_3$, is next deposited via chemical vapor deposition (CVD), procedures, to a thickness between about 50 to 200 Angstroms, overlying platinum storage node structure 20b, as well as overlying the top surface of third ILD layer 17. The high dielectric constant of $Ta_2O_5$, between about 20 to 30, and of $BaTiO_3$, between about 100 to 500, when employed as the capacitor dielectric layer, will allow the desired increase in the capacitor structure to be realized. Another platinum layer is next deposited to a thickness between about 1000 to 2000 Angstroms, again via use of a PVD procedure. Conventional photoresist and anisotropic RIE procedures, using $Cl_2$ as an etchant for platinum, and $CF_4$ as an etchant for the high k layer, are employed, to define capacitor top plate structure 23, comprised of platinum, and capacitor dielectric layer, comprised of high k layer 22. Removal of the photoresist shape, used for definition of the capacitor top plate structure, results in MIM capacitor structure 24, shown schematically in FIG. 9, comprised of platinum top plate structure 23, high k capacitor dielectric layer 22, and platinum storage node structure 20b, located in capacitor opening 18, and overlying, and contacting, platinum plug structure 16, which in turn was formed via an electroless plating procedure, using ruthenium as a seed layer.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal—insulator—metal (MIM), capacitor structure on a semiconductor substrate, comprising the steps of:

providing a conductive plug structure, located in an opening in a first interlevel dielectric (ILD), layer, overlying and contacting a source/drain region of a transfer gate transistor;

forming a composite landing pad structure on said first ILD layer, and on the top surface of said conductive plug structure, with said composite landing pad structure comprised with an overlying ruthenium layer;

depositing a second ILD layer, and an overlying silicon nitride layer;

forming a storage node contact hole in said silicon nitride layer, and in said second ILD layer, exposing a portion of the top surface of said ruthenium layer;

forming a platinum plug structure in said storage node contact hole;

forming a capacitor opening in a third ILD layer, exposing the top surface of said platinum plug structure, located at the bottom of said capacitor opening;

forming silicon nitride spacers on the sides of said capacitor opening;

forming a metal storage node structure on exposed surfaces of said capacitor opening, overlying and contacting the top surface of said platinum plug structure;

forming a high dielectric constant (high k), layer on said metal storage structure; and forming a metal top plate structure on said high k layer, resulting in said MIM capacitor structure comprised of said metal top plate structure, said high k layer, and said metal storage node structure.

2. The method of claim 1, wherein said conductive plug structure, located in said opening in said first ILD layer, is comprised of doped polysilicon.

3. The method of claim 1, wherein said composite landing pad structure is comprised of an underlying tungsten shape, defined from a tungsten layer which in turn was obtained via LPCVD procedures, at a thickness between about 1000 to 4000 Angstroms.

4. The method of claim 1, wherein said ruthenium layer, used to provide an overlying shape for said composite landing pad structure, is obtained via physical vapor deposition (PVD), at a thickness between about 300 to 2000 Angstroms.

5. The method of claim 1, wherein the diameter of said storage node contact hole, defined in said silicon nitride layer and in said second ILD layer, is between about 500 to 3000 Angstroms.

6. The method of claim 1, wherein said platinum plug structure is obtained via an electroless plating procedure, performed in a solution comprised of de-ionized water, dilute hydrofluoric acid, and platinum sulfate ($PtSO_4$), at a temperature between about 25 to 150° C., at a current density between about 3 to 100 amps/$cm^2$.

7. The method of claim 1, wherein said metal storage node structure is comprised of platinum, obtained via plasma vapour deposition of a platinum layer, to a thickness between about 300 to 800 Angstroms.

8. The method of claim 1, wherein said high k layer is a BaTiO$_3$ layer, obtained via chemical vapor deposition (CVD), procedures to a thickness between about 50 to 200 Angstroms, and with a dielectric constant between about 100 to 500.

9. The method of claim 1, wherein said metal top plate structure is comprised of platinum, obtained via plasma vapour deposition of a platinum layer, to a thickness between about 1000 to 2000 Angstroms, and defined via an anisotropic RIE procedure, using Cl$_2$ as an etchant for platinum.

10. A method of fabricating a metal—insulator—metal (MIM), capacitor structure on an underlying electroless plated, platinum storage node plug structure, comprising the steps of:

providing a transfer gate transistor comprised of a gate structure on an underlying gate insulator layer, with a source/drain region located in an area of a semiconductor substrate not covered by the gate structure;

depositing a first interlevel dielectric (ILD), layer;

forming a contact hole opening in said first ILD layer exposing a portion of the top surface of said source/drain region;

forming a doped polysilicon plug structure in said contact hole opening;

depositing a tungsten layer;

depositing a thin ruthenium layer;

patterning said thin ruthenium layer, and said tungsten layer, to define a landing pad structure located on said first ILD layer, and on the top surface of said doped polysilicon plug structure, with said landing pad structure comprised of a ruthenium seed shape on an underlying tungsten shape;

depositing a second ILD layer;

planarizing said second ILD layer;

depositing a silicon nitride layer;

forming a storage node contact hole in said silicon nitride layer and in said second ILD layer, exposing a portion of the top surface of said ruthenium seed shape;

performing an electroless plating procedure to form said platinum storage node plug structure in said storage node contact hole;

depositing a third ILD layer;

forming a capacitor opening in said third ILD layer, exposing the top surface of said platinum storage node plug structure;

forming silicon nitride spacers on the sides of said capacitor structure;

depositing a first platinum layer;

performing a chemical mechanical polishing procedure to remove portions of said first platinum layer from the top surface of said third ILD layer resulting in formation of a platinum storage node structure in said capacitor opening, overlying and contacting the top surface of said platinum storage node plug structure;

depositing a BaTiO$_3$ layer;

depositing a second platinum layer; and patterning of said second platinum layer, and of said BaTiO$_3$ layer, to form said MIM capacitor structure, comprised of a top plate defined from said second platinum layer, comprised of a capacitor dielectric featuring BaTiO$_3$, and comprised of said platinum storage node structure.

11. The method of claim 10, wherein said first interlevel dielectric (ILD), layer is comprised of silicon oxide, or of boro-phosphosilicate glass (BPSG), obtained via LPCVD or PECVD procedures, to a thickness between about 3000 to 7000 Angstroms.

12. The method of claim 10, wherein said doped polysilicon plug structure is obtained from a polysilicon layer, deposited via LPCVD procedures to a thickness between about 1500 to 3000 Angstroms, doped in situ during deposition via the addition of arsine, or phosphine, to a silane ambient.

13. The method of claim 10, wherein said tungsten layer is obtained via LPCVD procedures, to a thickness between about 1000 to 4000 Angstroms, using tungsten hexafluoride as a source.

14. The method of claim 10, wherein said thin ruthenium layer is obtained via physical vapor deposition (PVD), at a thickness between about 300 to 2000 Angstroms.

15. The method of claim 10, wherein said landing pad structure is defined via anisotropic RIE procedures, using Cl$_2$ or SF$_6$ as a n etchant for said tungsten layer and for said thin ruthenium layer.

16. The method of claim 10, wherein said second ILD layer is comprised of silicon oxide, or of boro-phosphosilicate glass (BPSG), obtained via LPCVD or PECVD procedures, to a thickness between about 3000 to 10000 Angstroms.

17. The method of claim 10, wherein said silicon nitride layer is obtained via LPCVD or PECVD procedures, to a thickness between about 300 to 1500 Angstroms.

18. The method of claim 10, wherein said storage node contact hole is formed in said silicon nitride layer, and in said second ILD layer, via an anisotropic RIE procedure using CF$_4$ or CHF$_3$ as an etchant.

19. The method of claim 10, wherein the diameter of said storage node contact hole, defined in said silicon nitride layer and in said second ILD layer, is between about 500 to 3000 Angstroms.

20. The method of claim 1, wherein said electroless plating procedure, used to form said platinum storage node plug structure, is performed in a solution comprised of deionized water, dilute hydrofluoric (DHF), acid, and platinum sulfate (PtSO$_4$), at a temperature between about 25 to 150° C., at a current density between about 3 to 100 amps/cm$^2$.

21. The method of claim 10, wherein said third ILD layer is comprised of silicon oxide, or of boro-phosphosilicate glass (BPSG), obtained via LPCVD or PECVD procedures, at a thickness between about 6000 to 15000 Angstroms.

22. The method of claim 10, wherein said first platinum layer is obtained via plasma vapour deposition procedures, at a thickness between about 300 to 800 Angstroms.

23. The method of claim 10, wherein said BaTiO$_3$ layer, is obtained via chemical vapor deposition (CVD), procedures to a thickness between about 50 to 200 Angstroms, and with a dielectric constant between about 100 to 500.

24. The method of claim 10, wherein said second platinum layer is obtained via plasma vapour deposition, to a thickness between about 1000 to 2000 Angstroms.

* * * * *